United States Patent
Saijo et al.

(10) Patent No.: US 10,138,558 B2
(45) Date of Patent: Nov. 27, 2018

(54) PRETREATMENT AGENT FOR ELECTROLESS PLATING, AND PRETREATMENT AND PRODUCTION OF PRINTED WIRING BOARD USING SAME

(71) Applicant: C. Uyemura & Co., Ltd., Osaka (JP)

(72) Inventors: Yoshikazu Saijo, Osaka (JP); Hisamitsu Yamamoto, Osaka (JP); Tetsuji Ishida, Osaka (JP); Takuya Komeda, Osaka (JP); Masayuki Utsumi, Osaka (JP)

(73) Assignee: C. UYEMURA & CO., LTD., Osaka (JP)

( * ) Notice: Subject to any disclaimer, the term of this patent is extended or adjusted under 35 U.S.C. 154(b) by 0 days.

(21) Appl. No.: 15/549,471

(22) PCT Filed: Jan. 25, 2016

(86) PCT No.: PCT/JP2016/052017
§ 371 (c)(1),
(2) Date: Aug. 8, 2017

(87) PCT Pub. No.: WO2016/129373
PCT Pub. Date: Aug. 18, 2016

(65) Prior Publication Data
US 2018/0023197 A1 Jan. 25, 2018

(30) Foreign Application Priority Data
Feb. 12, 2015 (JP) ................. 2015-025178

(51) Int. Cl.
C23C 18/20 (2006.01)
H05K 3/18 (2006.01)
H05K 3/38 (2006.01)
C23C 18/22 (2006.01)
C23C 18/38 (2006.01)

(52) U.S. Cl.
CPC ...... *C23C 18/2066* (2013.01); *C23C 18/2086* (2013.01); *H05K 3/18* (2013.01); *H05K 3/381* (2013.01); *C23C 18/22* (2013.01); *C23C 18/38* (2013.01); *H05K 3/181* (2013.01); *H05K 2203/0776* (2013.01); *H05K 2203/0793* (2013.01)

(58) Field of Classification Search
None
See application file for complete search history.

(56) References Cited

U.S. PATENT DOCUMENTS

| 4,515,829 | A  | * | 5/1985  | Decked ................. H05K 3/381 216/18 |
| 8,344,057 | B1 |   | 1/2013  | Hills et al. |
| 9,374,913 | B2 | * | 6/2016  | Saijo .................. C23C 18/2086 |
| 2004/0048752 | A1 |   | 3/2004 | Nguyen et al. |
| 2005/0014667 | A1 | * | 1/2005 | Aoyama .................. C11D 7/08 510/175 |
| 2005/0025960 | A1 |   | 2/2005 | Levey et al. |
| 2009/0192029 | A1 |   | 7/2009 | Levey et al. |
| 2009/0253573 | A1 |   | 10/2009 | Levey et al. |
| 2010/0120962 | A1 | * | 5/2010 | Yoshida ................. H05K 3/381 524/428 |
| 2011/0214994 | A1 | * | 9/2011 | Utsumi .................... C09K 3/00 205/211 |
| 2015/0072070 | A1 |   | 3/2015 | Saijo et al. |
| 2016/0010215 | A1 | * | 1/2016 | Saito .................. C23C 18/2066 428/447 |

FOREIGN PATENT DOCUMENTS

| CA | 2 292 005   | 6/2000  |
| EP | 1 396 606   | 3/2004  |
| JP | 59-52701    | 12/1984 |
| JP | 1-219169    | 9/1989  |
| JP | 4-56776     | 2/1992  |
| JP | 2005-13983  | 1/2005  |
| JP | 2013-129855 | 7/2013  |
| JP | 2015-71821  | 4/2015  |

OTHER PUBLICATIONS

Machine Translation for Japan 01-219169, which was first published in Japanese in 1989, 6 pages.*
English translation of JPH 04/56776, Feb. 1992; 5 pages.*
English translation of JP 2013/129855, Jul. 2013; 34 pages.*
International Search Report dated Apr. 12, 2016 in International (PCT) Application No. PCT/JP2016/052017.
Extended European Search Report dated Aug. 3, 2018 in European Application No. 16749018.4.

* cited by examiner

*Primary Examiner* — Helene Klemanski
(74) *Attorney, Agent, or Firm* — Wenderoth, Lind & Ponack, L.L.P.

(57) ABSTRACT

The ampholytic surfactants show the nature of anionic surfactants in an alkaline region and the nature of cationic surfactants in an acidic region. As described below, the pretreatment solution of the present invention may preferably indicate alkalinity of pH 8.5 or higher, and therefore, it exhibits the nature of cationic surfactants by the use of ampholytic surfactants. As the ampholytic surfactants, those disclosed in JP 2011-228517 A can be used.

6 Claims, No Drawings

US 10,138,558 B2

PRETREATMENT AGENT FOR ELECTROLESS PLATING, AND PRETREATMENT AND PRODUCTION OF PRINTED WIRING BOARD USING SAME

TECHNICAL FIELD

The present invention relates to a pretreatment agent for electroless plating, and a method for pretreating a substrate to be used for a printed wiring board using the same, and a process for producing a printed wiring board using the same. The pretreatment agent for electroless plating of the present invention is preferably used as a pretreatment agent of a substrate to be used for a printed wiring board before performing electroless plating on the surface of the substrate.

BACKGROUND ART

The printed wiring boards widely used in the electronics and other fields may often be produced by any of the additive methods using electroless plating. The additive methods are roughly classified into full-additive methods in which wiring is formed by only electroless plating and semi-additive methods in which wiring is formed by electroless plating and subsequent electroplating. More specifically, the surface of a substrate is roughened and then provided with a catalyst, followed by electroless plating such as electroless copper plating (the steps so far are called as a full-additive method), and if necessary, subsequent electroplating such as electrolytic copper plating (the steps so far are called as a semi-additive method), thereby forming a printed wiring board.

As described above, before electroless plating, a catalyst is used in order to activate a substrate. A reason for the use is that the substrate, which is served as an underlying member, is not electroconductive, and thus by previously carrying (imparting) of catalyst on the substrate, a plating film made of such as copper is easily formed on the substrate. The catalyst includes noble metals such as Pd, Ag, Au or Pt. In order to promote imparting effect of the catalyst to the underlying member, generally, a silane coupling agent is widely used (for example, Patent Documents 1 and 2).

The silane coupling agent is generally an organic silicon compound represented by Y—$(CH_3)_n$—Si—$(OR)_{3-n}$. In this formula, "Y" is an organic functional group such as an amino, epoxy, methacrylic, vinyl or mercapto group; and "OR" is a hydrolyzable group such as $OCH_3$, $OC_2H_5$, or $OCOCH_3$. The silane coupling agent has, in a single molecule thereof, both of the organic functional group "Y", which relates to a reaction or an interaction with an organic substance, and the hydrolyzable group "OR". Thus, the silane coupling agent has an effect of being bonded to, e.g., an organic polymer through "Y", and further forming a chemical bond to an inorganic substance surface by the hydrolysis and reaction of "OR" so that the two substances, which are different in chemical properties from each other, are strongly bonded to each other. When, e.g., Pd is used as the catalyst, it can be considered that particles of Pd is easily bonded to "OR" because of a high hydrophilicity and activity of "OR" so that Pd is coordinate-bonded to "OR" to form a chelate. Thus, the silane coupling agent comes to exist in the state of being bonded to both of the surface of an oxide (material to be plated) and the Pd particles. It is therefore considered that by electroless plating performed after the imparting process of the catalyst such as Pd, the resultant plating film adheres strongly to the surface of the oxide (material to be plated) through the silane coupling agent so that the adhesive strength therebetween is heightened. In the meantime, when the "Y" has an amino group, the whole of the silane coupling agent becomes hydrophobic so that the agent is affinitive with a photoresist painted onto a substrate made of, e.g., glass to be easily bonded to the substrate. As a result, the photoresist adheres strongly to the substrate through the silane coupling agent, and further the presence of the silane coupling agent also on the surface of the photoresist makes the following good: the adhesiveness of a plating film onto the surface of the photoresist.

PRIOR ART DOCUMENT

Patent Document

Patent Document 1: JP S59-52701 B
Patent Document 2: JP H4-56776 A

DISCLOSURE OF THE INVENTION

Problems to be Solved by the Invention

The pretreatment solution for electroless plating, which is used for treating the surface of a substrate to be used for a printed wiring board may usually contain a surfactant. In general, surfactants have highly foaming property and are easily formable. If the foams generated during the treatment are adsorbed onto the surface of a substrate or into holes such as though holes and blind via holes, the adhesion property of metal plating is deteriorated in the subsequent electroless plating and other steps, resulting in a deterioration of plating property.

The pretreatment solution for electroless plating is further required to have high penetrability into substrates. This is because if the pretreatment solution has low penetrability into substrates, some chemical solutions used in various steps cannot enter into holes such as though holes and blind via holes, resulting in that the adhesion property of plating is deteriorated in the holes. In general, surfactants are considered to have the action of enhancing penetrability against substrates. However, according to the results of the present inventors' experiment, it was found that surfactants alone do not have enough penetrability into substrates.

As described above, pretreatment solutions for electroless plating are strongly required to have low foaming property during treatment (foaming resistance) and high penetrability into substrates, in addition to the carrying action of catalyst to be used before electroless plating. Patent Documents 1 and 2 above are, however, completely silent on the evaluation of these requirements.

Under these circumstances, the present invention has been made to provide a novel pretreatment agent for electroless plating, which can attain high adsorption capacity of catalyst to be used before electroless plating, which can suppress the generation of foams in a short time to have high foaming resistance, and which can exhibit high penetrability into substrates. The present invention is further intended to provide a method for pretreating the surface of a substrate to be used for a printed wiring board and a process for producing a printed wiring board as described above.

Means for Solving the Problems

The pretreatment agent for electroless plating of the present invention, which can solve the above problem, comprises: a silane coupling agent; a surfactant; and ethylene-based glycol butyl ethers of formula: $C_4H_9$—$(OC_2H_4)_n$—OH where n is an integer of 1 to 4, and/or propylene-based glycol butyl ethers of formula: $C_4H_9$—$(OC_3H_6)_n$—OH where n is an integer of 1 to 4.

In a preferred embodiment of the present invention, the above pretreatment agent for electroless plating comprises: a silane coupling agent; a surfactant; and an ethylene-based glycol butyl ether of formula: $C_4H_9$—$(OC_2H_4)_n$—OH where n is an integer of 1 to 4.

In a preferred embodiment of the present invention, the above pretreatment agent for electroless plating may preferably have a pH of 8.5 or higher.

Further, the method for pretreating a substrate to be used for a printed wiring board according to the present invention, which can solve the above problem, comprises treating the surface of a substrate to be used for a printed wiring board with a pretreatment agent for electroless agent as described above.

Further, the process for producing a printed wiring board according to the present invention, which can solve the above problem, comprises: treating the surface of a substrate to be sued for a printed wiring board with a pretreatment agent for electroless plating as described above, and then performing electroless plating.

Effect of the Invention

According to the present invention, a pretreatment agent for electroless plating can be provided, which has excellent foaming resistance and penetrability as well as which enables excellent adsorption capacity of catalyst to be used before electroless plating. The adsorption of foams onto the surface of a substrate or into the inside of a though hole, a blind via hole, and any other hole can be prevented by the enhancement of foaming resistance before it happens, thereby improving the adhesion property of plating. As a result, productivity can also be enhanced. In addition, the pretreatment agent can sufficiently penetrate the roughened surface of a substrate because of its enhanced penetrability, thereby enhancing the addition effect of pretreatment agent. The pretreatment agent of the present invention can also be applied to the surface treatment of a substrate having though holes, blind via holes, and any other holes, which is to be used for a printed wiring board.

Mode for Carrying Out the Invention

The present inventors made studies to provide a pretreatment agent for electroless plating, excellent adsorption capacity of catalyst to be used before electroless plating, foaming resistance, and penetrability into substrates. As a result, they have found that the addition of a prescribed glycol ether, i.e., at least one of the ethylene-based glycol butyl ethers of formula: $C_4H_9$—$(OC_2H_4)_n$—OH where n is an integer of 1 to 4, and the propylene-based glycol butyl ethers of formula: $C_4H_9$—$(OC_3H_6)_n$—OH where n is an integer of 1 to 4, to a silane coupling agent and a surfactant makes it possible to enhance both foaming resistance and penetrability, while maintaining high adsorption amount of catalyst, thereby attaining the intended purpose and completing the present invention. The ethylene- or propylene-based glycol butyl ether to be used in the present invention may hereinafter be abbreviated as the glycol butyl ether.

In the present invention, the pretreatment agent for electroless plating means a treatment agent to be used before electroless plating. More particularly, it means a treatment agent to be used after a substrate is subjected to swelling treatment, roughening treatment, and, if necessary, neutralization treatment for reducing oxides generated in the roughening treatment, but before the substrate is subjected to electroless plating treatment, and it has usually been referred to as a conditioner. The pretreatment agent (solution) for electroless plating according to the present invention may hereinafter be referred to simply as the pretreatment agent (solution).

As described above, the pretreatment agent for electroless plating according to the present invention contains a silane coupling agent; a surfactant; and ethylene-based glycol butyl ether of formula: $C_4H_9$—$(OC_2H_4)_n$—OH where n is an integer of 1 to 4, and/or the propylene-based glycol butyl ether of formula: $C_4H_9$—$(OC_3H_6)_n$—OH where n is an integer of 1 to 4. More particularly, the pretreatment agent of the present invention is a mixture obtained by addition of water and a pH adjuster to the above components.

First, the following will describe the glycol ether that best characterizes the present invention. The glycol ether is one of the organic solvents, and has been used, for example, as a solvent for paint or ink. The glycol ether may include, for example, the ethylene glycol type (E.O. type) based on ethylene glycol, the propylene glycol type (P.O. type) based on propylene glycol, and other types. The present inventors have found for the first time that particular glycol ethers each having a butyl group substituted for one of the terminal hydrogen atoms, more specifically, the ethylene-based glycol butyl ether of formula (1):

$$C_4H_9\text{—}(OC_2H_4)_n\text{—}OH \tag{1}$$

where n is an integer of 1 to 4, and the propylene-based glycol butyl ether of following formula (2):

$$C_4H_9\text{—}(OC_3H_6)_n\text{—}OH \tag{2}$$

where n is an integer of 1 to 4, in the glycol ethers of the E.O. type and the P.O. type, have both foaming resistance action and penetration action.

More specifically, as demonstrated in working examples below, the use of any other glycol ether than the glycol butyl ethers of formulas (1) and (2) above did not enable the pretreatment agent to have all the desired characteristics. For example, comparative examples, each using a glycol ether of the E.O. type not having butyl group but methyl or another group (e.g., ethylene glycol dimethyl ether, diethylene glycol dimethyl ether, triethylene glycol methyl ether, triethylene glycol ethyl ether, or triethylene glycol dimethyl ether) are superior in foaming resistance, but are inferior in penetrability (see Nos. 14 to 18 in Table 1 below). Similarly, comparative examples, each using a glycol ether of the P.O. type not having butyl group but methyl group (e.g., dipropylene glycol dimethyl ether or dipropylene glycol monomethyl ether) are excellent in foaming resistance, but poor in penetrability (see Nos. 19 and 20 in Table 1 below). Among these, for example, the penetrability of Nos. 15 to 19 was as low as 2 minutes or longer.

In contrast, when a glycol butyl ether as specified in the present invention was used, penetrability was drastically enhanced, and, for example, the penetrability of Nos. 1 and 3 to 5 (working examples) improved to one second or shorter. It follows that a reduction effect was achieved to $\frac{1}{120}$ or higher as compared with the above comparative examples. It has not been known so far that only particular glycol butyl ethers as specified in the present invention among other glycol ethers can have extremely excellent penetrability improvement action.

Thus, the present invention is one having technical significance in that only glycol butyl ethers of formulas (1) and (2), in particular, among other glycol ethers have remarkable penetrability enhancement action as well as foaming resistance, while effectively exhibiting high adherence action of catalyst by adding a silane coupling agent, and the present invention is to be recognized as a so-called selection invention.

As the ethylene-based glycol butyl ether of formula (1), there can be mentioned ethylene glycol butyl ether (n=1), diethylene glycol butyl ether (n=2), triethylene glycol butyl ether (n=3), and tetraethylene glycol butyl ether (n=4). As the propylene-based glycol butyl ether of formula (2), there can be mentioned propylene glycol butyl ether (n=1), dipropylene glycol butyl ether (n=2), tripropylene glycol butyl ether (n=3), and tetrapropylene glycol butyl ether (n=4).

The term "butyl" as used in the glycol butyl ethers of formulas (1) and (2) may have a linear or branched chain structure.

Taking into consideration, for example, a further enhancement in penetrability, the glycol butyl ether may preferably be ethylene-based glycol butyl ethers of formula (1), more preferably diethylene glycol butyl ethers (such as diethylene glycol mono-n-butyl ethers).

In the present invention, glycol butyl ethers of formulas (1) and (2) may be used alone or in combination. As examples of combined use, there can be mentioned examples of using two or more glycol butyl ethers of formula (1), examples of using two or more glycol butyl ethers of formula (2), and examples of using at least one glycol butyl ether of formula (1) and at least one glycol butyl ether of formula (2).

If the total amount of silane coupling agent, surfactant, ethylene- or propylene-based glycol butyl ether, water, and pH adjuster is defined as the "whole amount of pretreatment agent", the amount of glycol butyl ether contained (this amount means the amount of only one glycol butyl ether contained, when the only one glycol butyl ether is contained in the pretreatment agent, or the total amount of two or more glycol butyl ethers contained, when the two or more glycol butyl ethers are contained in the pretreatment agent), relative to the whole amount of pretreatment agent, may preferably be 0.1 g/L to 500 g/L, more preferably 10 g/L to 300 g/L. When the amount of glycol butyl ether is smaller than the above lower limit, the addition effect of glycol butyl ether is not effectively exhibited, thereby lowing foaming resistance or penetrability. On the other hand, even if a glycol butyl ether is added beyond the above upper limit, the addition effect of glycol butyl ether is saturated, thereby becoming wasteful from an economical point of view.

The foregoing description was made for the glycol butyl ether that best characterizes the pretreatment agent of the present invention.

The pretreatment agent of the present invention further comprises a silane coupling agent and a surfactant.

The silane coupling agent to be used in the present invention is not particularly limited, so long as it can effectively exhibit an adherence action of catalyst such as Pd, but well-known one can be used. In order to exhibit excellent adherence action of catalyst, amino-based silane coupling agent rather than vinyl-based, epoxy-based, mercapto-based one is preferable. There can be mentioned, for example, 3-aminopropyltrimethoxysilane, 3-aminopropyltriethoxysilane, N-phenyl-3-aminopropyltrimethoxysilane, N-2(aminoethyl)3-aminopropyltrimethoxysilane, N-2(aminoethyl)3-aminopropylmethyldiethoxysilane, N-2(aminoethyl)3-aminopropylmethyldimethoxysilane or the like. These silane coupling agents may be added alone, or two or more of them may be used in combination. However, the type of the silane coupling agent to be used in the present invention is not limited to the above examples, and any material can be used, so long as it has an adherence action of catalyst. As the silane coupling agent, commercially available products may also be used.

The amount of silane coupling agent contained in the pretreatment solution (this amount means the amount of only one silane coupling agent contained, when the only one silane coupling agent is contained in the pretreatment solution, or the total amount of two or more silane coupling agents contained, when the two or more silane coupling agents are contained in the pretreatment solution) may preferably be from 0.1 g/L to 200 g/L, more preferably from 0.5 g/L to 150 g/L, relative to the total amount of pretreatment solution. When the amount of silane coupling agent is below the lower limit, the addition effect of silane coupling agent is not effectively exhibited, resulting in the lowering of adsorption amount of catalyst. On the other hand, even if a silane coupling agent is added in an amount beyond the upper limit, the addition effect of silane coupling agent is saturated, thereby becoming wasteful from an economical point of view.

The type of surfactant to be used in the present invention is not particularly limited, but non-ionic surfactants and ionic surfactants can be used. These surfactants may be added alone, or two or more of them may be used in combination.

Among these, the non-ionic surfactants are useful as the surface tension reducing agent of the pretreatment agent. When a cationic surfactant is used as an additional surfactant, the non-ionic surfactant further exhibits the action as a dispersant of the cationic surfactant. Preferred examples of the non-ionic surfactant may include polyoxyethylene alkyl ether; and polyoxyethylene alkyl phenyl ethers such as polyoxyethylene octyl phenyl ether and polyoxyethylene nonyl phenyl ether. These non-ionic surfactants may be added alone, or two or more of them may be used in combination.

The ionic surfactants include cationic surfactants, anionic surfactants, and ampholytic surfactants, all of which can be used in the present invention.

Among these, the cationic surfactants have the action of neutralizing electric charges by being adsorbed onto the surface of a negatively charged substrate. Preferred cationic surfactants are poly(diallyl dimethyl ammonium chloride), copolymers of poly(diallyl dimethyl ammonium chloride) and acrylamide, and polyethyleneimine.

The anionic surfactants have the action of neutralizing electric charges by being adsorbed onto the surface of a positively charged substrate. As the anionic surfactant, those disclosed in JP 2011-228517 A can be used.

The ampholytic surfactants show the nature of anionic surfactants in an alkaline region and the nature of cationic surfactants in an acidic region. As described below, the pretreatment solution of the present invention may preferably indicate acidity of pH 3.1 or below, and therefore, it exhibits the nature of cationic surfactants by the use of ampholytic surfactants. As the ampholytic surfactants, those disclosed in JP 2011-228517 A can be used.

In the present invention, the amount of the surfactant contained in the pretreatment agent (when only one surfactant is contained, it means the amount of this surfactant, or when two or more surfactants are contained, it means the total amount of these surfactants) may preferably be from 0.1 g/L to 500 g/L, more preferably from 1 g/L to 100 g/L, based on the whole amount of pretreatment agent. When the amount of surfactant is below the above lower limit, the addition effect of surfactant is not effectively exhibited, deteriorating the precipitation properties of an electroless Cu plating film onto a glass. On the other hand, even if a surfactant is added beyond the above upper limit, the addition effect of surfactant is saturated, becoming wasteful from an economical point of view.

The forgoing has described in detail the components constituting the pretreatment agent of the present invention.

The presentment agent of the present invention may preferably have a pH of 8.5 or higher. Thereby, the effect of adding the amine-based silane coupling agent preferably used in the present invention is effectively exhibited. The pH of the pretreatment agent is more preferably 9 or higher, and still more preferably 9.5 or higher. Incidentally, the upper limit thereof is generally about 13 or lower in consideration of such as damage to the substrate.

The pretreatment agent of the present invention may preferably have a pH as prescribed above, which pH is controlled by adding water to the above components and then adding a pH adjuster thereto. The pH adjuster is not particularly limited, so long as it can adjust the pH to the above alkaline region. For example, 2-aminopyridine may preferably be used.

In the present invention, the amount of the pH adjuster contained in the pretreatment agent, based on the whole amount of the pretreatment agent, may appropriately be controlled according to the composition of the pretreatment agent so that the pretreatment agent can have a preferred pH. The amount of the pH adjuster may preferably be from 0.1 g/L to 100 g/L, more preferably from 0.5 g/L to 50 g/L. When the amount of the pH adjuster is smaller than the above lower limit, a prescribed pH cannot be obtained, deteriorating adherence amount of catalyst. On the other hand, even when the amount of the pH adjuster is added in an amount beyond the above upper limit, pH lowering action is saturated, becoming wasteful from an economical point of view.

The foregoing has described the pretreatment agent of the present invention.

The pretreatment agent of the present invention may preferably be used as, but not limited to, a pretreatment agent in the production of a printed wiring board. More specifically, it may be used as a pretreatment agent, for example, in the production of a high density multilayer wiring board by a build-up construction method or a multilayer wiring board such as a wafer level CSP (Chip Size epoxy Package or Chip Scale epoxy Package) or TCP (Tape Carrier Package).

The following will describe the method for pretreatment of a substrate to be used for a printed wiring board according to the present invention. The pretreatment method of the present invention comprises treating the surface of a substrate to be used for a printed wiring board with a pretreatment agent for electroless plating as described above.

The pretreatment method of the present invention is characterized by the use of a pretreatment agent for electroless plating as described above, and the method of treating the surface of a substrate to be used for a printed wiring board is not particularly limited. The pretreatment method of the present invention will hereinafter be described. For details, reference can be made, for example, to the method disclosed in Patent Document 2 described above.

First, a substrate is prepared. The substrate to be used in the present invention is not particularly limited, so long as it is used for a printed wiring board, and there can be mentioned, for example, epoxy resin. As the substrate, a commercially available product can be used.

The substrate is then subjected to swelling treatment. The swelling treatment is performed to make the substrate surface easily roughened during roughening treatment in the later step. The method of swelling treatment is not particularly limited, but the substrate may be dipped into a conventional swelling treatment agent for a prescribed time. As the swelling treatment agent, there can be mentioned, for example, N-methyl-2-pyrrolidone, N,N-dimethylacetamide, N,N-dimethyl formamide, and γ-butyrolactone. These swelling treatment agents can be used alone or in combination. The dipping for swelling treatment may preferably be performed, for example, at a temperature of about 60 to 90° C. for about 10 to 30 minutes.

After the swelling treatment, the substrate is washed with water, and the resin surface is roughened with an etchant. As the etchant, there can preferably be used, for example, sodium permanganate, potassium permanganate, sodium chromate, and potassium chromate. These etchants can be used alone or in combination.

Then, if necessary, the residue that remains on the surface of the substrate after the roughening treatment may be dissolved away for removal. The residue does not always remain on the substrate surface, but, for example, when sodium permanganate or potassium permanganate is used as the etchant, manganese oxide derived from Mn remains on the substrate surface. Therefore, the substrate may preferably be dipped into a reducing treatment solution to make the substrate surface clean for the purpose of removing the oxide by reduction, neutralization, and dissolution. As the reducing treatment solution, there can preferably be used, for example, a reducing treatment solution containing one reducing agent, or two or more reducing agents, such as hydroxylamine sulfate, sodium hypophosphite, aminoborane, dimethylaminoborane, hydrosulfite, and formalin. The dipping in the reducing treatment solution may preferably be performed, for example, at a temperature of about 20 to 90° C. for about 5 to 30 minutes.

The substrate pretreated as described above is subjected to electroless plating, and if necessary, further electroplating. These plating processes will be described below in detail. The pretreatment agent of the present invention is used before electroless plating, after swelling treatment and subsequent roughening treatment, and if necessary, further reducing treatment, are performed as described above. More particularly, when reducing treatment is not performed, the pretreatment agent of the present invention is used after roughening treatment; or when reducing treatment is performed, the pretreatment agent of the present invention is used simultaneously with or after the reducing treatment. For example, when the pretreatment agent of the present invention is used simultaneously with reducing treatment, a treatment agent may preferably be used, which agent is prepared by mixing a reducing agent as described above with a silane coupling agent, a surfactant, and a glycol butyl ether, all of which constitute the pretreatment agent of the present invention, followed by addition of water and a pH adjuster to adjust the pH in a range of, for example, 8.5 or higher.

The following will describe a process for producing a printed wiring board according to the present invention. The producing process of the present invention comprises treating the surface of a silica-based filler-containing insulating resin substrate to be used for a printed wiring board, with a pretreatment agent for electroless plating as described above, and then performing electroless plating. If necessary, electroplating may be performed thereafter.

The producing process of the present invention has a feature that use is made of a pretreatment agent for electroless plating as described above according to the present invention. Regarding a method of treating the surface of a substrate to be used for a printed wiring board, and a method of subsequent electroless plating, although there is no particular limitation, reference can be made, for example, to the methods disclosed in Patent Document 2 described above. For reference, one example of the above producing process is shown in Table 2 below, but the present invention is not limited to this. Among these, the surface treatment method of a substrate to be used for a printed wiring board has been described in the above, and the following will describe an electroless plating method.

The electroless plating method is a plating method using no current, in contrast to an electroplating method using an external current. The electroless plating method is roughly classified into a displacement plating method (also referred to as an immersion plating method), in which a metal material to be plated is immersed into a plating solution to be plated, and a reduction plating method (also referred to as a chemical plating method), utilizing a chemical reduction reaction. The electroless plating to be used in the production of a printed wiring board is one of a reduction plating method described above.

First, before electroless plating is performed, the substrate, of which surface has been treated by the above method, is subjected to cleaning treatment. This makes dirt, oil, etc., removed from the surface of the substrate. In addition, wettability is improved to enhance the adhesion strength between the substrate and the plating film. The cleaning treatment is not particularly limited, but the substrate may be dipped into a solution available in a conventional cleaning treatment for a prescribed time.

The surface of the substrate is then slightly roughened (softly etched) with an etchant such as sulfuric acid or sodium persulfate, and the residue remaining on the surface is removed with a pickling solution such as sulfuric acid.

A catalyst metal as the core of electroless plating is then imparted (adsorbed) on the surface of the substrate. The method of imparting a catalyst metal is not particularly limited, but it may include, for example, dipping the substrate into a catalyst metal-containing solution for a prescribed time. As the catalyst metal, there can be mentioned, for example, Pd (e.g., $Pd^{2+}$), palladium chloride (e.g., $PdCl_2 \cdot 2H_2O$), stannous chloride (e.g., $SnCl_2 \cdot 2H_2O$). They can be used alone or in combination (of which typical example is a Pd—Sn complex). The catalyst solution may be prepared by a method in which hydrochloric acid (HCl) is added to the catalyst metal described above, followed by addition of water. The catalyst solution may preferably have a concentration of the catalyst metal, for example, 100 to 300 mg/L as the Pd concentration, 10 to 20 g/L as the Sn concentration, and 150 to 250 mL/L as the HCl concentration. More specifically, the substrate is put into the catalyst solution having a concentration as described above and dipping treatment is performed at a temperature of 30 to 40° C. for 1 to 3 minutes to make a Pd—Sn colloid adsorbed on the surface of the substrate.

The catalyst metal adsorbed as described above is then dipped into an accelerator-containing solution to activate the catalyst metal. This activation treatment provides the removal of, for example, Sn from the Pd—Sn complex, resulting in the formation and adsorption of metal Pd on the substrate surface. Finally, this metal Pd serves as a catalyst to accelerate the deposition of plating metal (typically, Cu) in the subsequent electroless plating. As the accelerator, there can be mentioned, for example, sulfuric acid solutions, hydrochloric acid solutions, sodium hydroxide solutions, and ammonia solutions. These solutions may preferably have a concentration in a range of, for example, 50 to 100 mL/L. The dipping condition may preferably be at room temperature (i.e., 20 to 25° C.) for about 1 to 5 minutes.

In imparting the catalyst metal, pretreatment may be performed using various solutions, such as predip, activator, and reducer, before using an accelerator as described above. This results in an enhancement of adhesion strength between a substrate and a plating film. In addition, the wettability of the catalyst onto the surface of the substrate becomes more favorable. For various solutions as described above, use can be made of well-known ones, or commercially available products may also be used.

After the catalyst metal may be imparted as described above, if necessary, by the formation of a plating resist pattern to mask other portions than a part to be deposited with a plating film, which plating resist pattern is intended to form a prescribed circuit pattern on a substrate to be used for a printed wiring board. The resist pattern may be removed, after plating treatment, by etching treatment or the like, or the resist pattern may be used as a solder resist without being removed after plating treatment. The method of forming a plating resist pattern is not particularly limited, but well-known methods can be used.

A plating film is then formed by an electroless plating method to form a circuit pattern. The substrate may be dipped into a well-known treatment solution before performing electroless plating, so that the catalyst adhered onto the surface of the substrate is reduced for activation to accelerate the deposition of a plating metal. As the treatment solution, there can be mentioned, for example, 10% sulfuric acid solution and reducer. As the reducer, use can be made of well-known ones, or commercially available products may also be used.

The electroless plating method is not particularly limited, but the substrate may be dipped into an electroless plating bath. As the electroless plating bath, there can be mentioned, for example, a copper plating bath containing a complexing agent such as EDTA or Rochelle salt. The composition of the electroless plating bath is not particularly limited, but as one example of the composition of an EDTA-containing electroless copper plating bath, there can be mentioned, for example, one containing 10 g/L of copper sulfate and 30 g/L of EDTA and being adjusted to a pH of 12.5 with sodium hydroxide. The dipping into an electroless plating bath may preferably be performed under a condition of, for example, a temperature of 60 to 80° C. for 30 to 600 minutes. When a substrate having blind via or other holes to be used for a multilayer wiring board, a plating solution may preferably be stirred sufficiently for a full supply of copper ions into the blind via during electroless plating. The stirring method is not particularly limited, but there can be used, for example, air stirring or any other stirring such as pump circulation.

In the electroless plating treatment, two-step plating may be performed to further enhance the adhesion between the substrate and the plating film. More specifically, primary plating treatment to form an underlying plating film on a substrate is first performed, and then, a secondary plating treatment to form a thick plating film, of which thickness becomes thicker than the underlying plating film, on the underlying plating film may be performed to form a circuit pattern.

A desired printed wiring board is thus obtained, but if necessary, electroplating may be performed after the electroless plating. The method of electroplating is not particularly limited, but well-known methods can be used. In addition, cleaning with a cleaner or the like, and pickling, may be performed before the electroplating. These methods are also not particularly limited.

The present application claims the benefit of priorities from Japanese Patent Application No. 2015-25178, filed on Feb. 12, 2015, and Japanese Patent Application No. 2015-25178, filed on Feb. 12, 2015, both the entire contents of which are incorporated herein by reference.

EXAMPLES

The present invention will hereinafter be described more specifically by way of Examples, but the present invention is not limited to the following Examples. The present invention can be put into practice after appropriate modifications or variations within a range meeting the gist described above and below, all of which are included in the technical scope of the present invention.

Example 1

In this Example, various pretreatment solutions were used, which were prepared to contain components shown in Table 1 and adjusted to pH 10 by addition of 2-aminopyridine (5 g/L) as a pH adjuster and water. In this example, amine-based silane coupling agent (KBE-903 available from Shin-Etsu Chemical Co., Ltd.) was used as a silane coupling agent. In Table 1, the nonionic surfactant means NYMEEN S220 available from NOF Corporation, and the cationic surfactant means FPA1001L available from Senka Corporation. The silane coupling agent had a concentration of 5 g/L in all cases, and all the surfactants had a concentration of 4 g/L regardless of type.

With regard to various pretreatment solutions described above, penetrability and foaming resistance were evaluated as follows.

(Evaluation of Penetrability)

In this Example, the pretreatment solutions were evaluated for penetrability by a felt precipitation method. For the purpose of penetrability evaluation, cut pieces of felt (JA 3t available from Yoneshima Felt Co., Ltd.) were prepared in size of 20 mm height, 20 mm width, and 3 mm thickness.

First, 100 mL of each of various pretreatment solutions was poured into a 100 mL beaker, and heated to the pretreatment temperature (40° C.) as shown in Table 2 below. Then, one felt cut piece was dropped from the position 20 to 30 mm higher than the surface of the pretreatment solution, and time required for the felt cut piece to come in contact with the surface of the pretreatment solution and leave the surface of the pretreatment solution (start to settle) was measured. The felt cut piece will settle when the pretreatment solution penetrates the felt cut piece, so that the pretreatment solution exhibiting shorter time is evaluated as having more excellent penetrability.

(Evaluation of Foaming Resistance)

In this Example, the pretreatment solutions were evaluated for foaming resistance by a shaking method.

First, 20 mL of each of various pretreatment solutions described above was poured into a 100 mL stopper-equipped measuring cylinder, and heated to the treatment temperature (40° C.) as shown in Table 2 below. The measuring cylinder was then closed with the stopper, and shaken vertically 10 times, after which the stopper was opened, and the height of bubbles from the solution surface ($H_{t=0min}$) was measured just after the stopper opening (at t=0 min.). The measuring cylinder was left standing for three minutes, and time (in seconds) until the bubbles were varnished was measured. The pretreatment solution exhibiting shorter time until bubbles are varnished is evaluated as having more excellent foaming resistance. In this regard, when the bubbles were not varnished even after left standing for three minutes, the height of bubbles from the solution surface ($H_{t=3min}$) was measured after left standing for three minutes (at t=3 min.), and its difference ($=H_{t=0min}-H_{t=3min}$, i.e., the height of bubbles remaining without being varnished) was calculated.

Further, in order to measure for the amount of Pd adsorption, the amount of Pd adsorption was measured using the above various pretreatment solutions as follows.

(Measurement of the Amount of Pd Adsorption)

As a substrate, a substrate CCL-HL832 was used which was a BT material for semiconductor packages available from Mitsubishi Gas Chemical Co., Inc. In accordance with steps shown in Table 2, the substrate is swollen, roughened and neutralized with a reducing solution, and subsequently dried, and then treated with each of various pretreatment solutions shown in Table 1. Next, the resultant was softly etched and pickled, and subsequently a Pd catalyst was formed thereto through the imparting process of catalyst (predip, activator and reducer). Table 2 was further shown an accelerator as the imparting process of catalyst. However, in this measurement, no accelerator treatment was performed. This is because any accelerator is a treatment for performing electroless copper plating to be unnecessary for evaluating the amount of Pd adsorption by using each of the various pretreatment solutions. After the above mentioned treatment, Pd adsorbed on the substrate surface was dissolved with aqua regia, and then the amount of Pd adsorption was measured by an atomic absorption method using an atomic absorption spectrometer (Z-5300 available from Hitachi, Ltd.). It is demonstrated that as the Pd adsorption amount is larger, the adsorbing effect of Pd is higher.

The results are shown in Table 1.

TABLE 1

| Test No. | Pretreatment solution | | | Silane coupling agent | Type of surfactant | Evaluation | | |
|---|---|---|---|---|---|---|---|---|
| | Glycol ether | | | | | Penetrability | Pd adsorption amount | Foaming resistance |
| | Classification | Type | Concentration | | | Felt precipitation mMethod | Atomic absorption method | Shaking method |
| 1 | Ethylene glycol types | Ethylene glycol mono-n-butyl ether | 100 g/L | Contained | Nonionic | 1 sec.or below | 65 ug/dm$^2$ | 14 sec. |
| 2 | | Diethylene glycol mono-n-butyl ether | 10 g/L | Contained | Nonionic | 8 sec. | 67 ug/dm$^2$ | 20 sec. |
| 3 | | Diethylene glycol mono-n-butyl ether | 100 g/L | Contained | Nonionic | 1 sec.or below | 69 ug/dm$^2$ | 15 sec. |

TABLE 1-continued

| Test No. | Pretreatment solution | | | Silane coupling agent | Type of surfactant | Evaluation | | |
|---|---|---|---|---|---|---|---|---|
| | Glycol ether | | | | | Penetrability Felt precipitation mMethod | Pd adsorption amount Atomic absorption method | Foaming resistance Shaking method |
| | Classification | Type | Concentration | | | | | |
| 4 | | Diethylene glycol mono-n-butyl ether | 100 g/L | Contained | Cationic | 1 sec.or below | 63 ug/dm² | 15 sec. |
| 5 | | Diethylene glycol mono-n-butyl ether | 300 g/L | Contained | Nonionic | 1 sec.or below | 64 ug/dm² | 16 sec. |
| 6 | | Triethylene glycol mono-n-butyl ether | 100 g/L | Contained | Nonionic | 4 sec. | 62 ug/dm² | 17 sec. |
| 7 | | Tetraethylene glycol mono-n-butyl ether | 100 g/L | Contained | Nonionic | 5 sec. | 65 ug/dm² | 19 sec. |
| 8 | Propylene | Propylene glycol mono-n-butyl ether | 100 g/L | Contained | Nonionic | 3 sec. | 67 ug/dm² | 18 sec. |
| 9 | glycol types | Dipropylene glycal mono-n-butyl ether | 100 g/L | Contained | Nonionic | 3 sec. | 62 ug/dm² | 19 sec. |
| 10 | | Tripropylene glycol mono-n-butyl ether | 100 g/L | Contained | Nonionic | 4 sec. | 64 ug/dm² | 17 sec. |
| 11 | | Tetrapropylene glycol mono-n-butyl ether | 100 g/L | Contained | Nonionic | 6 sec. | 63 ug/dm² | 17 sec. |
| 12 | | — | — | Not contained | Nonionic | 2 min. or more | 63 ug/dm² | 75 mm (Foam remaining) |
| 13 | Ethylene | Diethylene glycol mono-n-butyl ether | 100 g/L | Contained | Nonionic | 1 sec.or below | 35 ug/dm² | 15 sec. |
| 14 | glycol types | Ethylene glycol dimethyl ether | 100 g/L | Contained | Nonionic | 1 min. 40 sec. | 62 ug/dm² | 18 sec. |
| 15 | | Diethylene glycol dimethyl ether | 100 g/L | Contained | Nonionic | 2 mio. or more | 60 ug/dm² | 18 sec. |
| 16 | | Triethylene glycol methyl ether | 100 g/L | Contained | Nonionic | 2 mio. or more | 62 ug/dm² | 18 sec. |
| 17 | | Triethylene glycol ethyl ether | 100 g/L | Contained | Nonionic | 2 mio. or more | 63 ug/dm² | 18 sec. |
| 18 | | Triethylene glycol dimethyl ether | 100 g/L | Contained | Nonionic | 2 mio. or more | 62 ug/dm² | 18 sec. |
| 19 | Propylene | Dipropylene glycol monomethyl ether | 100 g/L | Contained | Nonionic | 2 mio or more | 60 ug/dm² | 18 sec. |
| 20 | glycol types | Dipropylene glycol dimethyl ether | 100 g/L | Contained | Nonionic | 1 min. 30 sec. | 62 ug/dm² | 17 sec. |

TABLE 2

| Steps | | Name of chemicals | concentration | Treatment temperature (° C.) | Treatment time (min.) |
|---|---|---|---|---|---|
| Swelling | | APPDES-37 available from C. Uyemura & Co., Ltd. | 500 mL/L | 50 | 10 |
| Roughening | | MDE-40 available from C. Uyemura & Co., Ltd. | 100 mL/L | 80 | 20 |
| | | ELC-SH available from C. Uyemura & Co., Ltd. | 140 mL/L | | |
| Neutralization | | APPDES MDN-62 available from C. Uyemura & Co., Ltd. | 100 mL/L | 35 | 5 |
| Drying Pretreatment solution | | See Table 1 | | 40 | 5 |
| Soft etching | | Sodium persulfate | 100 g/L | 25 | 1 |
| | | Sulfuric acid | 100 g/L | | |
| Pickling | | Sulfuric acid | 100 g/L | 25 | 1 |
| Catalyst imparting | Predip | ALCUP MDP-2 available from C. Uyemura & Co., Ltd. | 10 mL/L | 25 | 2 |
| | | Sulfuric acid | 3 g/L | | |
| | Activator | ALCUP MAT-SP available from C. Uyemura & Co., Ltd. | 50 mL/L | 40 | 5 |
| | | 1N-NaOH | 40 mL/L | | |
| | Reducer | ALCUP MAB-4-A available from C. Uyemura & Co., Ltd. | 10 mL/L | 35 | 3 |
| | | ALCUP MAB-4-C available from C. Uyemura & Co., Ltd. | 50 mL/L | | |
| | | ALCUP MRD-2-C available from C. Uyemura & Co., Ltd. | 10 mL/L | | |
| | Accelerator | THRU-CUP MEL-3-A available from C. Uyemura & Co., Ltd. | 50 mL/L | 25 | 1 |
| Electroless copper plating | | THRU-CUP PEA-6-A available from C. Uyemura & Co., Ltd. | 100 mL/L | 36 | 15 |

TABLE 2-continued

| Steps | Name of chemicals | concentration | Treatment temperature (° C.) | Treatment time (min.) |
|---|---|---|---|---|
| | THRU-CUP PEA-6-B-2X available from C. Uyemura & Co., Ltd. | 50 mL/L | | |
| | THRU-CUP PEA-6-C available from C. Uyemura & Co., Ltd. | 14 mL/L | | |
| | THRU-CUP PEA-6-D available from C. Uyemura & Co., Ltd. | 15 mL/L | | |
| | THRU-CUP PEA-6-E available from C. Uyemura & Co., Ltd. | 50 mL/L | | |
| Drying Heat treatment | | | 150 | 30 |
| Cleaner | THRU-CUP MSC-3-A available from C. Uyemura & Co., Ltd. | 100 mL/L | 40 | 5 |
| Pickling | Sulfuric acid | 100 g/L | 25 | 1 |
| Electrolytic copper plating | THRU-CUP ETN (2.5 A/dm$^2$) available from C. Uyemura & Co., Ltd. | | 25 | 45 (25 μm) |
| Decoloration | THRU-CUP AT-21 available from C. Uyemura & Co., Ltd. | 1 mL/L | 25 | 1 |
| Drying Heat treatment | | | 190 | 60 |

The following discussion can be made from Table 1.

Test Nos. 1 to 11 are working examples using glycol butyl ethers as specified herein. In all the cases of ethylene glycol types (Nos. 1 to 7) or propylene glycol types (Nos. 8 to 11), the tested pretreatment solutions were excellent in all of penetrability, foaming resistance, and Pd adsorption amount. This effect was effectively exhibited, regardless of the surfactant type (see Test Nos. 3 and 4).

On the other hand, Test Nos. 12 to 20 are comparative examples of each using a pretreatment solution failing to fulfill any of the requirements of the present invention. These comparative examples had the following problems.

Test No. 13 is a comparative example of using a pretreatment solution, which contains a glycol butyl ether as specified herein and a surfactant, but no any silane coupling agent. As shown in Table 1, Test No. 13 was excellent in penetrability and foaming resistance but had significantly lowered Pd adsorption amount. It is therefore understood that the addition of a silane coupling agent is essential to allow Pd used as a catalyst to be adsorbed on the substrate at a high concentration.

Test No. 12 is a comparative example of using a pretreatment solution, which contains a silane coupling agent and a surfactant, but no glycol butyl ether. As shown in Table 1, Test No. 12 could ensure a high Pd adsorption amount because of containing a silane coupling agent, but was deteriorated in penetrability because of containing no glycol butyl ether and further deteriorated in foaming resistance because of foam remaining even after left standing for three minutes when foaming test was performed. From the results of Test Nos. 12 and 13 above, it is understood that the addition of a glycol butyl ether is essential to ensure penetrability and foaming resistance.

Test Nos. 14 to 20 are comparative examples of each using a pretreatment solution, which contains a silane coupling agent and a surfactant, but a glycol ether other than specified herein. These comparative examples were all satisfactory in Pd adsorption amount and foaming resistance, but were significantly deteriorated in penetrability. In particular, considering penetrability, these comparative examples were significantly deteriorated in penetrability as compared with Test Nos. 1 to 11 using glycol butyl ethers as specified herein.

These results have demonstrated that only glycol butyl ethers as specified herein, particularly even in glycol ethers, can enhance both penetrability and foaming resistance.

The invention claimed is:

1. A pretreatment agent for electroless plating, comprising:
    a silane coupling agent;
    a surfactant; and
    ethylene-based glycol butyl ethers of formula: $C_4H_9$—$(OC_2H_4)_n$OH where n is an integer of 1 to 4, and/or propylene-based glycol butyl ethers of formula: $C_4H_9$—$(OC_3H_6)_n$OH where n is an integer of 1 to 4.

2. The pretreatment agent for electroless plating according to claim 1, having a pH of 8.5 or higher.

3. A pretreatment agent for electroless plating, comprising:
    a silane coupling agent;
    a surfactant; and
    ethylene-based glycol butyl ethers of formula: $C_4H_9$—$(OC_2H_4)_n$—OH where n is an integer of 1 to 4.

4. The pretreatment agent for electroless plating according to claim 3, having a pH of 8.5 or higher.

5. A method for pretreating a substrate to be used for a printed wiring board, comprising:
    treating the surface of a substrate to be used for a printed wiring board with a pretreatment agent according to claim 1.

6. A process for producing a printed wiring board, comprising:
    treating the surface of a substrate to be used for a printed wiring board with a pretreatment agent for electroless plating according to claim 1; and
    then performing electroless plating.

* * * * *